US012069827B2

(12) United States Patent
Heiskanen

(10) Patent No.: US 12,069,827 B2
(45) Date of Patent: Aug. 20, 2024

(54) HINGE ASSEMBLY FOR CONTROLLED FOLDING OF AN ELECTRONIC DEVICE

(71) Applicant: Huawei Technologies Co., Ltd., Shenzhen (CN)

(72) Inventor: Juuso Heiskanen, Helsinki (FI)

(73) Assignee: Huawei Technologies Co., Ltd., Shenzhen (CN)

( * ) Notice: Subject to any disclaimer, the term of this patent is extended or adjusted under 35 U.S.C. 154(b) by 183 days.

(21) Appl. No.: 17/755,119

(22) PCT Filed: Oct. 22, 2019

(86) PCT No.: PCT/EP2019/078677
§ 371 (c)(1),
(2) Date: Apr. 21, 2022

(87) PCT Pub. No.: WO2021/078366
PCT Pub. Date: Apr. 29, 2021

(65) Prior Publication Data
US 2022/0369487 A1   Nov. 17, 2022

(51) Int. Cl.
*H05K 5/02*   (2006.01)
*G06F 1/16*   (2006.01)
(Continued)

(52) U.S. Cl.
CPC ......... *H05K 5/0226* (2013.01); *G06F 1/1618* (2013.01); *G06F 1/1652* (2013.01);
(Continued)

(58) Field of Classification Search
CPC .. H05K 5/0226; H05K 5/0018; G06F 1/1618; G06F 1/1652; G06F 1/1681;
(Continued)

(56) References Cited

U.S. PATENT DOCUMENTS 5,987,704 A    11/1999  Tang
6,481,683 B1 * 11/2002  Stewart .............. A47B 21/0314
                                                    108/50.01
(Continued)

FOREIGN PATENT DOCUMENTS

CN        1536460 A    10/2004
CN      101563910 A    10/2009
(Continued)

*Primary Examiner* — Anthony M Haughton
*Assistant Examiner* — Theron S Milliser
(74) *Attorney, Agent, or Firm* — Slater Matsil, LLP

(57) ABSTRACT

A hinge assembly for an electronic device, the hinge assembly being moveable between an unfolded position and at least a first folded end position, and comprising a row of interconnected and abutting hinge blades and at least one linear actuator. The hinge blades are aligned in a common plane when the hinge assembly is in the unfolded position, each hinge blade being rotated relative neighboring hinge blades around a first hinge assembly rotation axis, when the hinge assembly is moved to the first folded end position. The linear actuator comprises a rotation shaft and a plurality of linear drive arrangements having different lengths. The rotation shaft extends in parallel with the first hinge assembly rotation axis and comprises sections having different diameters.

20 Claims, 6 Drawing Sheets

(51) Int. Cl.
*H04M 1/02* (2006.01)
*H05K 5/00* (2006.01)

(52) U.S. Cl.
CPC ......... *G06F 1/1681* (2013.01); *H05K 5/0018* (2022.08); *H04M 1/0268* (2013.01)

(58) Field of Classification Search
CPC ...... G06F 2203/04102; H04M 1/0268; H04M 1/022; H04M 1/0216; E05Y 2900/606
See application file for complete search history.

(56) References Cited

U.S. PATENT DOCUMENTS

| | | | |
|---|---|---|---|
| 9,606,583 B2* | 3/2017 | Ahn | G06F 1/1681 |
| 9,625,947 B2* | 4/2017 | Lee | G06F 1/1616 |
| 9,720,454 B2 | 8/2017 | Shi et al. | |
| 9,729,688 B2* | 8/2017 | Lee | G06F 1/1626 |
| 9,785,200 B1* | 10/2017 | Knoppert | G06F 1/1616 |
| 9,910,465 B2* | 3/2018 | Tazbaz | G06F 1/1681 |
| 9,952,631 B2* | 4/2018 | Xin | G06F 1/1641 |
| 10,185,368 B2* | 1/2019 | Knoppert | G06F 1/1681 |
| 10,209,743 B1* | 2/2019 | Hsu | G06F 1/1681 |
| 10,225,936 B2* | 3/2019 | Yang | G06F 1/1652 |
| 10,231,347 B2* | 3/2019 | Seo | H04M 1/0216 |
| 10,429,894 B2* | 10/2019 | Xia | G06F 1/1641 |
| 10,431,129 B2* | 10/2019 | Wakata | G09F 9/301 |
| 10,705,565 B2* | 7/2020 | Park | G06F 1/1641 |
| 10,798,836 B2* | 10/2020 | Manuel | E05F 1/12 |
| 10,915,139 B2* | 2/2021 | Park | G06F 1/1641 |
| 11,076,499 B2* | 7/2021 | Jeon | H05K 5/0017 |
| 11,079,807 B1* | 8/2021 | Robinson | E05D 7/00 |
| 11,391,320 B2* | 7/2022 | Hsu | E05D 3/122 |
| 11,490,532 B2* | 11/2022 | Chen | E05D 11/105 |
| 11,696,415 B2* | 7/2023 | Xie | H04M 1/0216 361/807 |
| 2009/0070961 A1 | 3/2009 | Chung et al. | |
| 2011/0157780 A1 | 6/2011 | Wang et al. | |
| 2014/0104765 A1 | 4/2014 | Hoshino | |
| 2014/0226275 A1* | 8/2014 | Ko | G06F 1/1601 361/679.27 |
| 2015/0017317 A1 | 1/2015 | Shirley et al. | |
| 2015/0055287 A1* | 2/2015 | Seo | G06F 1/1681 361/679.27 |
| 2015/0361696 A1 | 12/2015 | Tazbaz | |
| 2016/0116944 A1* | 4/2016 | Lee | G06F 1/1681 361/679.26 |
| 2016/0118616 A1* | 4/2016 | Hiroki | H10K 50/8428 257/40 |
| 2016/0132075 A1* | 5/2016 | Tazbaz | G06F 1/1616 361/679.27 |
| 2016/0349802 A1* | 12/2016 | Ahn | G06F 1/1681 |
| 2017/0364123 A1 | 12/2017 | Seo et al. | |
| 2017/0374751 A1* | 12/2017 | Yang | H05K 5/0017 |
| 2018/0049336 A1* | 2/2018 | Manuel | F16C 11/04 |
| 2018/0059738 A1* | 3/2018 | Knoppert | G06F 1/1615 |
| 2018/0314299 A1* | 11/2018 | Xia | H04M 1/022 |
| 2019/0245955 A1* | 8/2019 | Lee | H04M 1/0268 |
| 2019/0250663 A1* | 8/2019 | Park | G06F 1/1618 |
| 2020/0042042 A1* | 2/2020 | Park | H10K 77/111 |
| 2020/0178410 A1* | 6/2020 | Jeon | G09F 9/301 |
| 2021/0199153 A1* | 7/2021 | Hsu | E05D 3/122 |

FOREIGN PATENT DOCUMENTS

| | | |
|---|---|---|
| CN | 107003695 A | 8/2017 |
| CN | 108122492 A | 6/2018 |
| EP | 3115537 A1 | 1/2017 |

\* cited by examiner

HINGE ASSEMBLY FOR CONTROLLED FOLDING OF AN ELECTRONIC DEVICE

CROSS REFERENCE TO RELATED APPLICATIONS

This application is a National Stage of International Application No. PCT/EP2019/078677, filed on Oct. 22, 2019, which is hereby incorporated by reference in its entirety.

TECHNICAL FIELD

The disclosure relates to a hinge assembly for an electronic device, the hinge assembly being moveable between an unfolded position and at least a first folded end position, and comprising at least one linear actuator.

BACKGROUND

The size of electronic devices, such as tablets and mobile phones, is an important consideration when designing electronic devices. The user oftentimes requests the outer dimensions of the device to be as small as possible while still providing a display which is as large as possible.

This problem may be solved, e.g., by means of a foldable electronic device comprising one or several support bodies, e.g. interconnected by means of hinges, covered by a display. The support body/bodies and the display can be folded together to provide an as small electronic device as possible, and unfolded to provide an as large display as possible.

However, as the electronic device is folded, the display and/or the support body/bodies will stretch on one side of the neutral axis and compress on the other side of the neutral axis. The neutral axis is the axis along which the display or the housing remains unchanged as it is folded, i.e. it neither stretches nor compresses.

One solution is to provide the electronic device with a resilient connection between the display and the support body, the resilient connection taking up any stretching and compression. However, the resilient connection and the configuration of the hinges still affects the appearance of the display, leaving the surface of the display uneven.

SUMMARY

It is an object to provide an improved foldable electronic device. The foregoing and other objects are achieved by the features of the independent claim. Further implementation forms are apparent from the dependent claims, the description, and the figures.

According to a first aspect, there is provided a hinge assembly for an electronic device, the hinge assembly being moveable between an unfolded position and at least a first folded end position, the hinge assembly comprising a row of interconnected and abutting hinge blades and at least one linear actuator, the hinge blades being aligned in a common plane when the hinge assembly is in the unfolded position, each hinge blade being rotated relative to neighboring hinge blades around a first hinge assembly rotation axis, when the hinge assembly is moved to the first folded end position, the linear actuator comprising a rotation shaft and a plurality of linear drive arrangements having different lengths, the rotation shaft extending in parallel with the first hinge assembly rotation axis and comprising sections having different diameters, a first end of each linear drive arrangement being interconnected with a section of the rotation shaft having one diameter, a second, opposite end of each linear drive arrangement being connected to one hinge blade, an actuator axis extending between the first and second ends of each linear drive arrangement and perpendicular to the first hinge assembly rotation axis, wherein actuation of the linear actuator along the actuator axis urges each hinge blade to rotate relative neighboring hinge blades around the first hinge assembly rotation axis.

Such a solution allows for a hinge assembly which has as small outer dimensions as possible, while having a range of motion which allows, e.g., two components interconnected by the hinge assembly, such as two electronic device frame sections, to be moved between an unfolded position, in which the frame sections extend to provide a maximum electronic device width, and a folded position in which the two sections are superimposed onto each other such that they extend to provide only a minimum electronic device width. Furthermore, the solution provides support to any components which extend the two interconnected components across the hinge assembly. Furthermore, each hinge blade has its own manufacturing and rotation tolerance, however, with this solution the different tolerances do not stack up and hence, the impact on the display is minimized.

In a possible implementation form of the first aspect, rotation of the neighboring hinge blades is initiated successively in response to the differing diameters of the rotation shaft. Such a solution allows rotation of neighboring hinge blades to be initiated successively in response to the differing diameters of the linear drive arrangements. The smaller the diameter, the less the linear drive arrangement will move and the less the hinge blade will rotate. Hence, the desired turning profile is set for each hinge blade.

In a further possible implementation form of the first aspect, the hinge assembly comprises at least a first linear actuator and a second linear actuator, the first linear actuator comprising a first rotation shaft and plurality of first linear drive arrangements, the second linear actuator comprising a second rotation shaft and plurality of second linear drive arrangements, the first rotation shaft and the second rotation shaft extending in parallel, the first linear drive arrangements and the second linear drive arrangements extending in parallel. This allows the smallest diameter to be increased for the hinge blades which rotate the least.

In a further possible implementation form of the first aspect, one of the first linear drive arrangements and one of the second linear drive arrangements are connected to the same hinge blade, synchronizing the actuation of the first linear actuator and the second linear actuator, keeping the movement of all rotation shafts and hinge blades synchronized.

In a further possible implementation form of the first aspect, a first dimension of a first outer surface of the hinge assembly is larger than a corresponding second dimension of a second outer surface of the hinge assembly when the hinge assembly is in the first folded end position, the first linear actuator and/or the second linear actuator being actuated by a difference between the first dimension and the second dimension. This allows for a hinge assembly which has as small outer dimensions as possible, while having a range of motion which allows, e.g., the first frame section and the second frame section to be moved between the unfolded position, in which the bodies extend to provide a maximum electronic device width, and a folded position in which the two bodies are superimposed onto each other such that they extend to provide only a minimum electronic device width.

In a further possible implementation form of the first aspect, the linear drive arrangement comprises a chain or a wire.

In a further possible implementation form of the first aspect, the hinge assembly comprises a neutral axis, a first end of the linear drive arrangement engaging the rotation shaft, and a second end of the linear drive arrangement engaging a first location and a second location of an individual hinge blade, the first location and the second location being located on opposite sides of, and with equidistant spacing from, the neutral axis, the linear drive arrangement extending through any hinge blades located in a first area between the individual hinge blade and the rotation shaft, the linear drive arrangement comprising a first section and a second section extending on opposite sides of, and with equidistant spacing from, the neutral axis, a first rotation of the rotation shaft rotating the linear drive arrangement in a first direction, and a second rotation of the rotation shaft rotating the linear drive arrangement in a second direction. As a result, the movement generated by the linear actuator is synchronized on both sides of the neutral axis.

In a further possible implementation form of the first aspect, the linear drive arrangement comprises a wire partially wound around the rotation shaft, providing a secure, simple, and reliable linear actuation.

In a further possible implementation form of the first aspect, the hinge assembly comprises a neutral axis, and the linear drive arrangement comprises a first section and a second section extending through an individual hinge blade and engaging the rotation shaft at a first end of the linear drive arrangement, the first section and the second section extending partially on opposite sides of, and with equidistant spacing from, the neutral axis, the first section extending in a first area between the first end and the individual hinge blade, on a first side of the neutral axis, and the second section extending in the first area on a second side of the neutral axis, the first section and the second section furthermore engaging the individual hinge blade by extending through the individual hinge blade such that the first section extends from the first side of the neutral axis to the second side of the neutral axis, and the second section extends from the second side of the neutral axis to the first side of the neutral axis, the first section extending, in a second area between the individual hinge blade and a second end of the linear drive arrangement, on the first side of the neutral axis and the second section extending, in the second area, on the first side of the neutral axis, allowing any hinge blades located in the second area to be pivoted in a first direction around the first hinge assembly rotation axis, and, simultaneously, allowing any hinge blades located in the first area to be pivoted in an opposite, second direction around a second hinge assembly rotation axis extending in parallel with the first hinge assembly rotation axis. This facilitates a hinge assembly which has an as small width as possible while still allowing the hinge to fold the components, which the hinge assembly interconnects, completely together.

In a further possible implementation form of the first aspect, the first section and the second section furthermore engage a second individual hinge blade by extending through the second individual hinge blade such that the first section extends back from the second side of the neutral axis to the first side of the neutral axis, and the second section extends back from the first side of the neutral axis to the second side of the neutral axis, the first section extending, in a third area between the second individual hinge blade and the second end of the linear drive arrangement, on the first side of the neutral axis, and the second section extending, in the third area, on the second side of the neutral axis, allowing any hinge blades located in the third area to be pivoted in the opposite, second direction around a third hinge assembly rotation axis extending in parallel with the first hinge assembly rotation axis.

According to a second aspect, there is provided an electronic device comprising a first frame section, a second frame section, a display connected to at least one of the first frame section and the second frame section, and a hinge assembly according to the above interconnecting the first frame section and the second frame section such that the first frame section and the second frame section are pivotable, relative each other, between an unfolded position and a first folded end position, the first frame section and the second frame section being aligned in a common plane when in the unfolded position, the second frame section being superimposed on the first frame section when in the first folded end position. This facilitates an electronic device having a range of motion which allows, e.g., two components interconnected by the hinge assembly, such as two electronic device frame sections, to be moved between an unfolded position, in which the frame sections extend to provide a maximum electronic device width, and a folded position in which the two sections are superimposed onto each other such that they extend to provide only a minimum electronic device width. Furthermore, each hinge blade of the hinge assembly has its own manufacturing and rotation tolerances, which tolerances do not stack up leaving the impact on the display minimal.

In a possible implementation form of the second aspect, the hinge assembly interconnects the first frame section and the second frame section such that the first frame section and the second frame section are pivotable, relative each other, between an unfolded position and a second folded end position, the first frame section being superimposed on the second frame section when in the second folded end position.

This and other aspects will be apparent from and the embodiments described below.

BRIEF DESCRIPTION OF THE DRAWINGS

In the following detailed portion of the present disclosure, the aspects, embodiments and implementations will be explained in more detail with reference to the example embodiments shown in the drawings, in which.

DETAILED DESCRIPTION OF ILLUSTRATIVE EMBODIMENTS

Figure 10A:
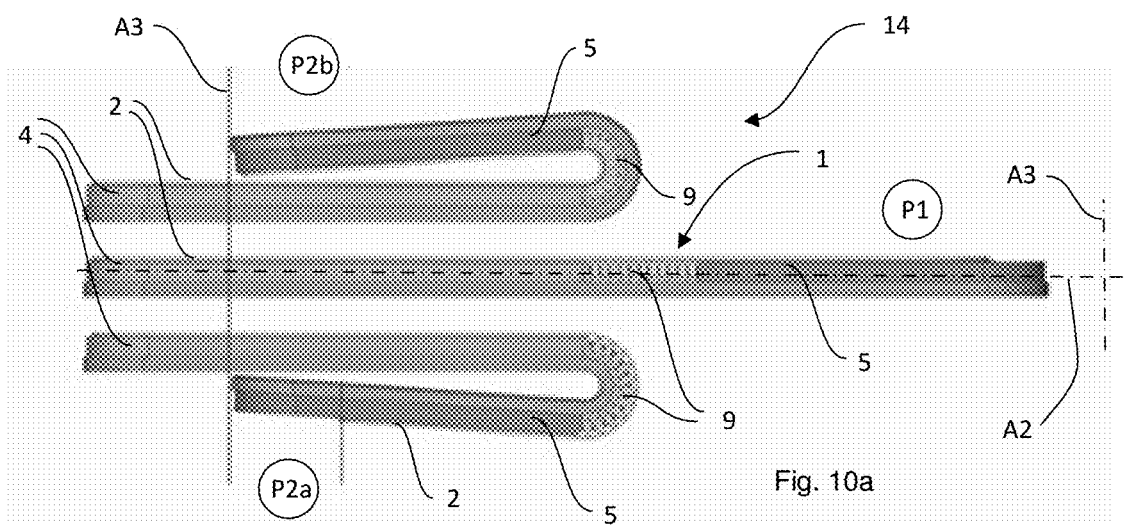
FIG. 10a shows a cross-sectional side view of an electronic device in accordance with one embodiment of the present invention, wherein the electronic device is in an unfolded position as well as in both folded end positions.
Figure 10B:
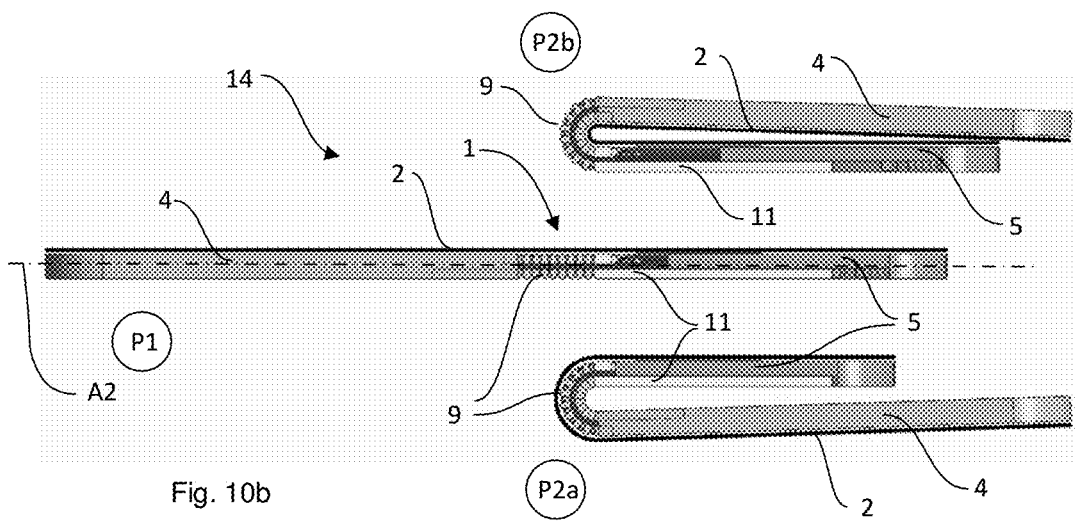
FIG. 10b shows a cross-sectional side view of an electronic device in accordance with one embodiment of the present invention, wherein the electronic device is in an unfolded position as well as in both folded end positions.

FIGS. 10a and 10b show an electronic device 14 comprising a first frame section 4, a second frame section 5, and a display 2 connected to at least one of the first frame section 4 and the second frame section 5. A hinge assembly 1 interconnects the first frame section 4 and the second frame section 5 such that the first frame section 4 and the second frame section 5 are pivotable, relative each other, between an unfolded position P1 and at least a first folded end position P2a around the first hinge assembly rotation axis A1a. In a further embodiment, the first frame section 4 and the second frame section 5 are also pivotable, relative each other, between an unfolded position P1 and a second folded end position P2b. As the hinge assembly 1 is folded, the electronic device 14 is also folded from an unfolded position to a folded end position.

The first frame section 4 and the second frame section 5 are aligned in a common plane when in the unfolded position P1, as shown in the center drawings of FIGS. 10a and 10b.

Furthermore the second frame section 5 is superimposed on top of the first frame section 4 when in the first folded end position P2a, as shown in the top drawings of FIGS. 10a and 10b. In a further embodiment, the first frame section 4 is superimposed on top of the second frame section 5 when in the second folded end position P2b, as shown in the bottom drawings of FIGS. 10a and 10b.

Figure 1A:
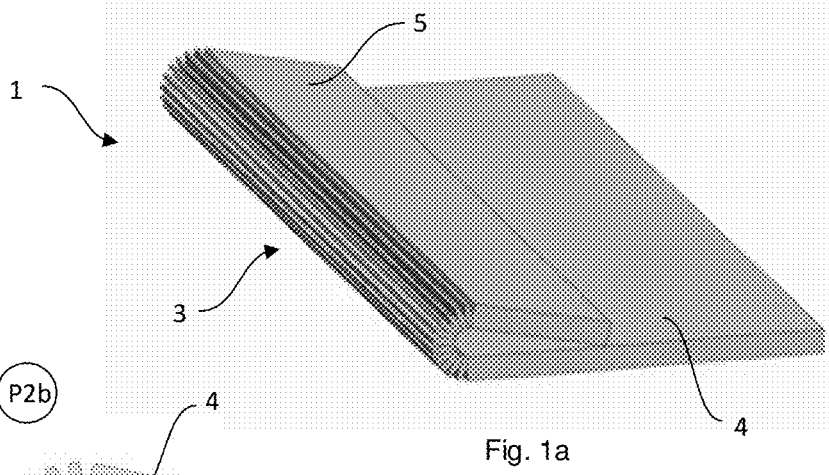
FIG. 1a shows a simplified perspective view of a hinge assembly in accordance with one embodiment of the present invention, wherein the hinge assembly is in a folded position.

FIG. 1a shows a simplified perspective view of an embodiment of the hinge assembly 1. The hinge assembly 1 is moveable between the unfolded position P1 and at least one folded end position, preferably between the unfolded position P1, a first folded end position P2a, and a second folded end position P2b.

Figure 1B:
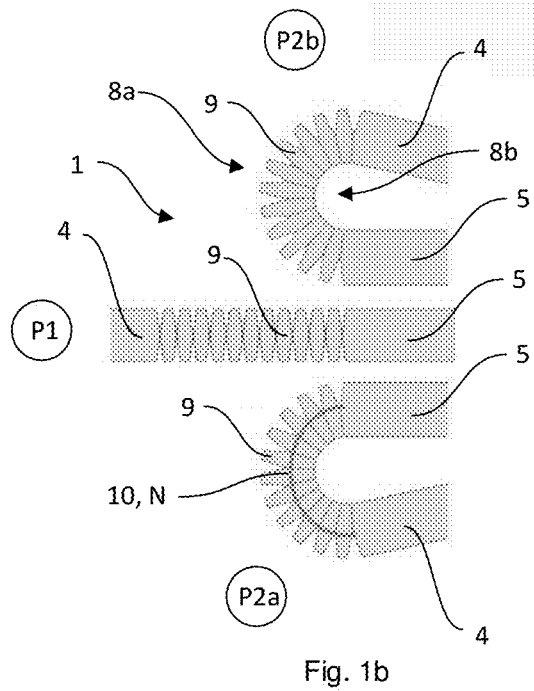
FIG. 1b shows a schematic side view of the embodiment of FIG. 1a, wherein the hinge assembly is in an unfolded position as well as in both folded end positions.
Figure 1C:
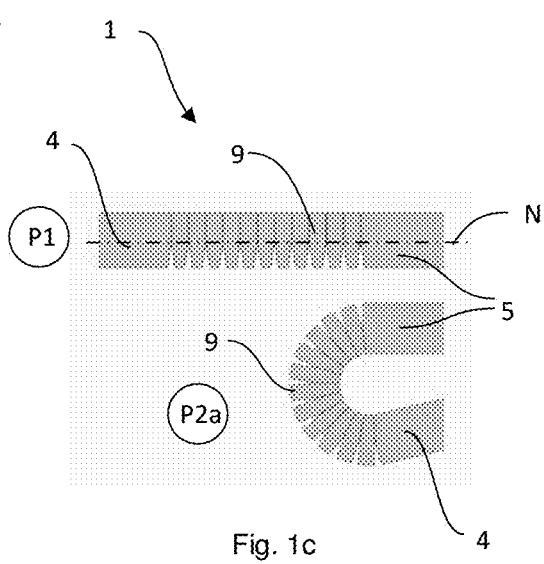
FIG. 1c shows a schematic side view of a hinge assembly in accordance with a further embodiment of the present invention, wherein the hinge assembly is in an unfolded position and in a folded end position.
Figure 2:
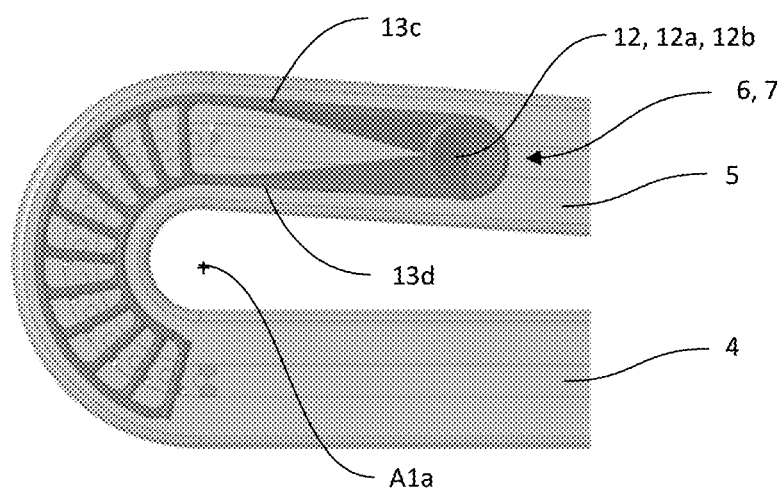
FIG. 2 shows a cross-sectional side view of a hinge assembly in accordance with one embodiment of the present invention, wherein the hinge assembly is in a folded position.
Figure 3:
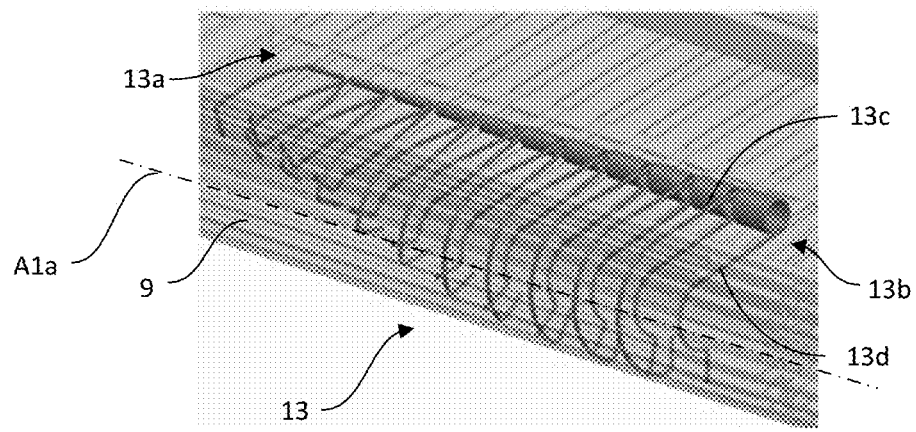
FIG. 3 shows a partial perspective view of a hinge assembly in accordance with one embodiment of the present invention, wherein the hinge assembly is in a folded position.

The hinge assembly 1 comprises a row of interconnected and abutting hinge blades 9 and at least one linear actuator 6, 7. The hinge blades 9 are at least partially tapered and interconnected by means of an elongated connection element 10 extending along the actuator axis A2, as shown in FIGS. 1b and 9b. The hinge blades 9 may be tapered in one direction, as shown in FIG. 1c, or in two directions, as shown in FIG. 1b. One-directional tapering allows the hinge assembly 1 to fold in only one direction, e.g. to first folded end position P2a, while bi-directional tapering allows the hinge assembly 1 to fold in two directions, i.e. to first folded end position P2a as well as second folded end position P2b.

Figure 8:
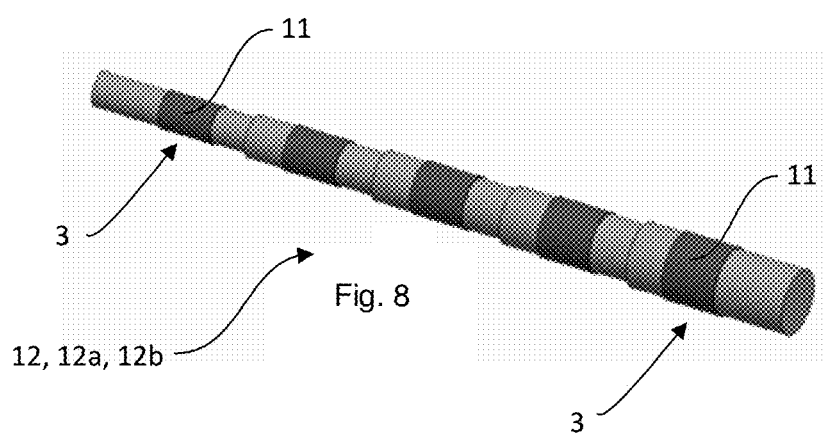
FIG. 8 shows a perspective view of a rotation shaft of a hinge assembly in accordance with one embodiment of the present invention.

Each linear actuator 6, 7 comprises a rotation shaft 12 and a plurality of linear drive arrangements 13 having different lengths 10, as shown in FIGS. 2 to 6. The rotation shaft 12 extends in parallel with the first hinge assembly rotation axis A1a and comprises a plurality of sections 3 having different diameters 11, as shown in FIG. 8. The rotation shaft 12 may extend within the first frame section 4 or the second frame section 5, for ease of reading the rotation shaft 12 is shown as located within the second frame section 5 in the FIGS. and in the text below.

Figure 4:
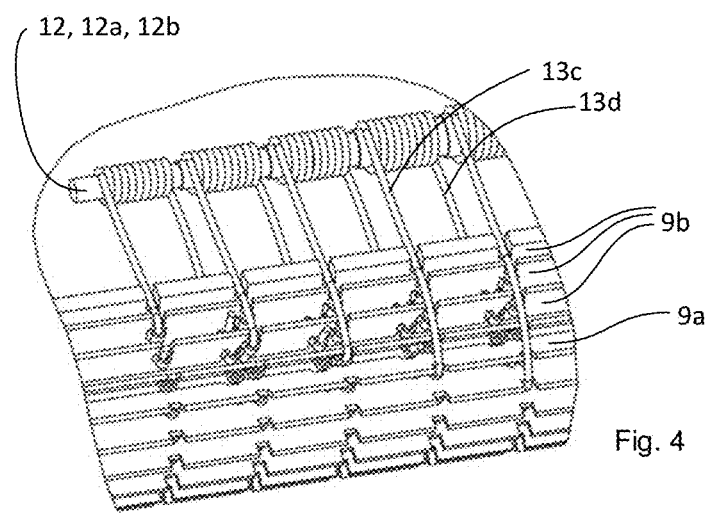
FIG. 4 shows a more detailed view of the embodiment of FIG. 3.

A first end 13a of each linear drive arrangement 13 is interconnected with one section 3 of the rotation shaft 12 having one diameter 11, and a second, opposite end of each linear drive arrangement 13 is connected to one hinge blade 9, as shown in FIG. 4. The actuator axis A2 extends between the first and second ends 13b of the linear drive arrangement 13 and perpendicular to the first hinge assembly rotation axis A1a. The connection may be releasable or fixed using, e.g., adhesive or fasteners such as screws.

Since the smallest diameter 11 on the rotation shaft 12 might be too small for the hinge blades 9 which rotate the least, i.e. the hinge blades 9 located nearest to the second frame section 5, and hence the rotation shaft 12, the smallest diameter 11 may be increased by providing two or more linear actuators 6, 7, i.e. a first rotation shaft 12a connected to a first plurality of linear drive arrangements 13 and a second rotation shaft 12b connected to a second plurality of linear drive arrangements 13. In order to keep all rotation shafts and hinge blades synchronized, one linear drive arrangement 13 of the first linear actuator 6 and one linear drive arrangement 13 of the second linear actuator 7 are connected to the same hinge blade 9.

Figure 6:
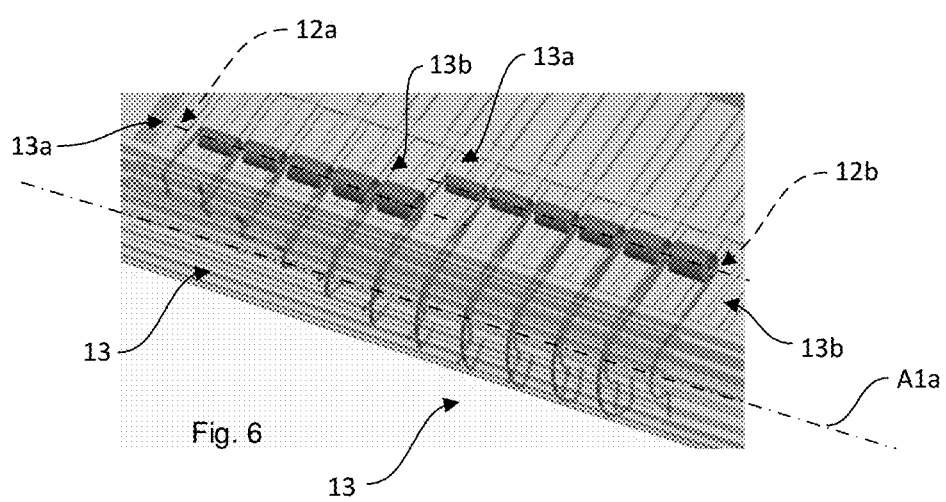
FIG. 6 shows a partial perspective view of a hinge assembly in accordance with one embodiment of the present invention, wherein the hinge assembly is in a folded position.

In one embodiment, the first rotation shaft 12a and the second rotation shaft 12b extend in parallel, and the first linear drive arrangements 13 and the second linear drive arrangements 13 extend in parallel, as indicated by FIG. 6.

The hinge blades 9 are aligned in a common plane when the hinge assembly 1 is in the unfolded position P1, and each hinge blade 9 is rotated relative neighboring hinge blades 9 around the first hinge assembly rotation axis A1a, when the hinge assembly 1 is moved to the first folded end position P2a or to the second folded end position P2b.

Actuation of the linear actuator 6, 7 along the actuator axis A2 may urge each hinge blade 9 to rotate relative neighboring hinge blades 9 around the first hinge assembly rotation axis A1a. Rotation of the neighboring hinge blades 9 is initiated successively in response to the differing diameters 11 of the linear drive arrangements 13. The smaller the diameter, the less the linear drive arrangement 13 will move, and the less the hinge blade 9 will rotate. Hence, the desired turning profile is set for each hinge blade 9.

In one embodiment, pivoting of the first frame section 4 and/or the second frame section 5 around the first hinge assembly rotation axis A1a actuates the first linear actuator 6 and the second linear actuator 7, such that one of the display 2 and the second frame section 5 are urged to move, in relation to the hinge assembly 1, along the actuator axis A2. Movement of the display 2 in relation to the hinge assembly 1 is shown in FIG. 10a. Movement of the second frame section 5 in relation to the hinge assembly 1 is shown in FIG. 10b.

In a further embodiment the hinge assembly 1 comprises a foldable back cover, the linear actuator 6 being connected to the display and the linear actuator 7 being connected to the back cover (not shown). In such an embodiment, the linear actuator 7 urges the back cover to move, in relation to the hinge assembly 1, along the actuator axis A2 but in a direction opposite to that of the display 2. In one embodiment, the display 2 moves in a first direction and the back cover moves in an opposite, second direction along the actuator axis A2. This opposite movement is indicated in FIG. 9c by means of arrows.

Figure 9A:
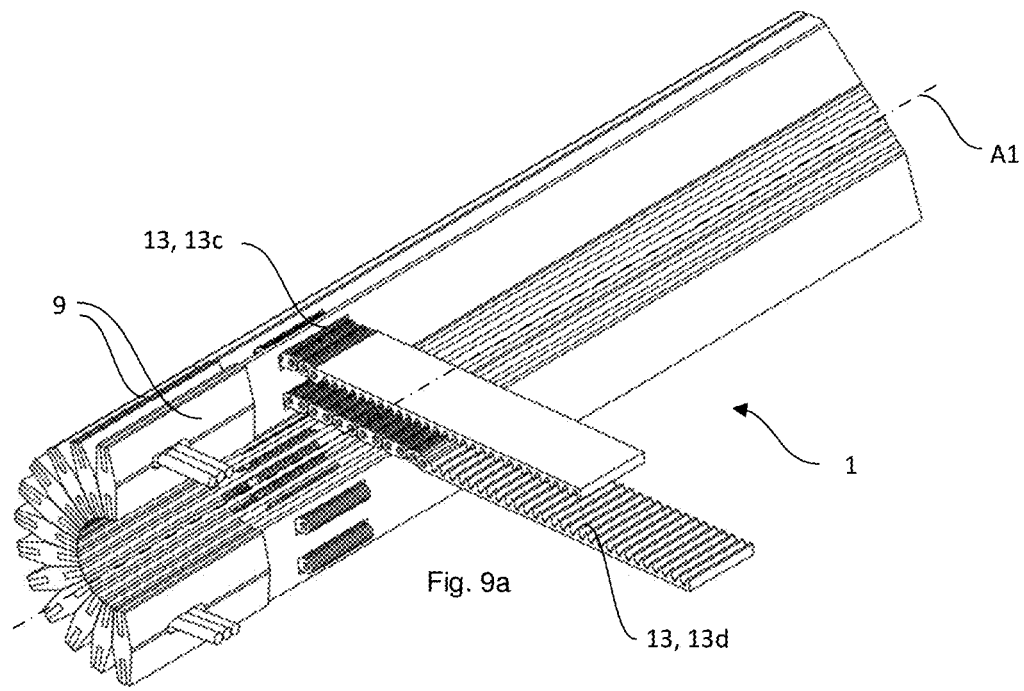
FIG. 9a shows a partial perspective view of a hinge assembly in accordance with one embodiment of the present invention, wherein the hinge assembly is in a folded end position.
Figure 9B:
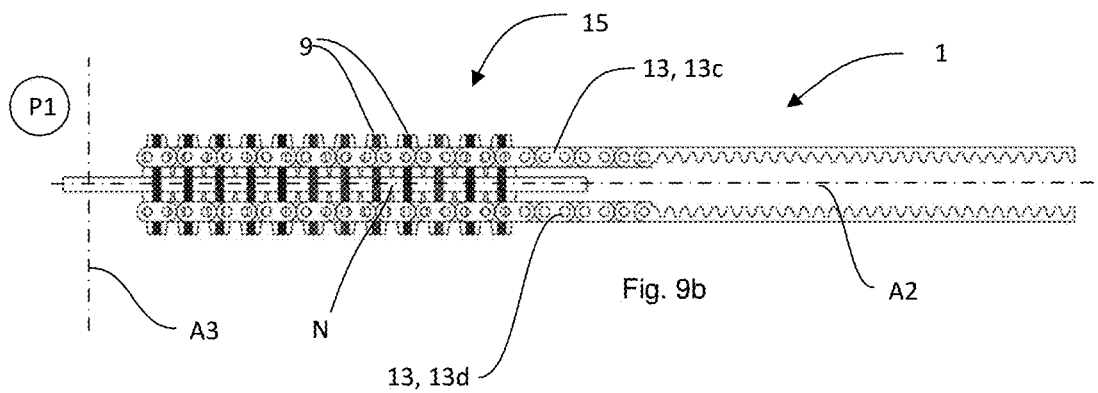
FIG. 9b shows a partial side view of a hinge assembly in accordance with one embodiment of the present invention, wherein the hinge assembly is in an unfolded position.
Figure 9C:
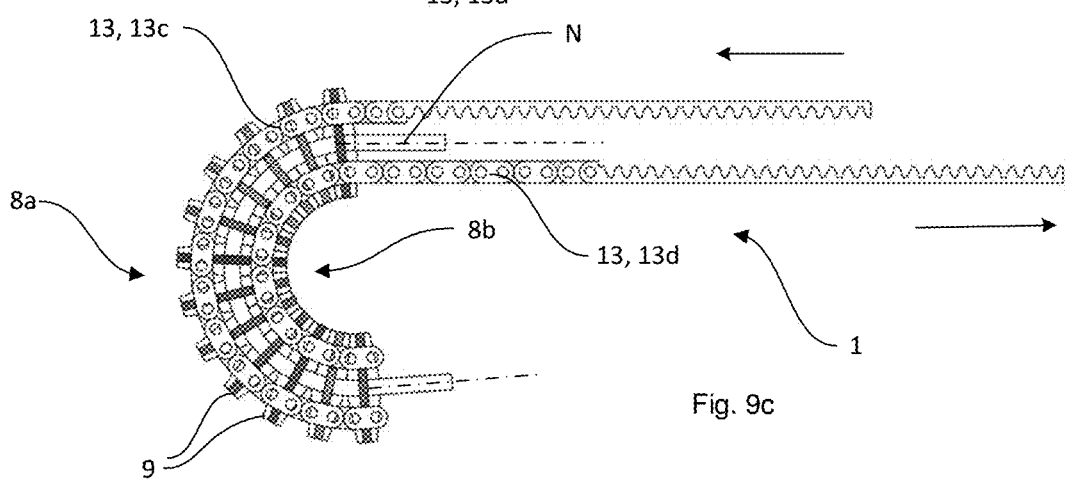
FIG. 9c shows a partial side view of the embodiment of FIG. 9b, wherein the hinge assembly is in a folded end position.

A first dimension of a first outer surface 8a of the hinge assembly 1, i.e. the outer circumference of the folded hinge assembly 1, is larger than a corresponding second dimension of a second outer surface 8b of the pivot hinge 15 the inner circumference of the folded hinge assembly 1, when the hinge assembly 1 is in a folded end position, as shown in FIG. 9c. The linear actuator 6, 7 is actuated by the difference between the first dimension and the second dimension. As the hinge assembly 1 is folded to end position P2a, the dimensions of the first outer surface 8a increases and the linear drive arrangement 13 is pulled in one direction, as is shown in the lowermost drawing of FIGS. 1b, 10a, and 10b. Correspondingly, as the hinge assembly 1 is folded to the opposite end position P2b, the dimensions of the first outer surface 8a decreases and the linear drive arrangement 13 is pulled in the opposite direction, as is shown in the uppermost drawing of FIGS. 1b, 10a, 10b.

In one embodiment, the hinge assembly 1 comprises a neutral axis N as indicated in FIG. 1c. A first end 13a of the linear drive arrangements 13 engages the rotation shaft 12, and a second end 13b of each linear drive arrangement 13 engages a first location and a second location of an individual hinge blade 9a. The first location and the second location are located on opposite sides of, and with equidistant spacing from, the neutral axis N. Each linear drive arrangement 13 extends through any hinge blades 9b located in a first area between the individual hinge blade 9a and the rotation shaft 12. In other words, each linear drive arrangement 13 comprises a first section 13c and a second section 13d extending on opposite sides of, and with equidistant spacing from, the neutral axis N, see e.g. FIGS. 3 and 5. A first rotation of the rotation shaft 12 rotates the linear drive arrangements 13 in a first direction, and a second opposite rotation of the rotation shaft 12 rotates the linear drive arrangements 13 in a second opposite direction. The center axis of the rotation shaft 12 intersects the neutral axis N.

Figure 7:
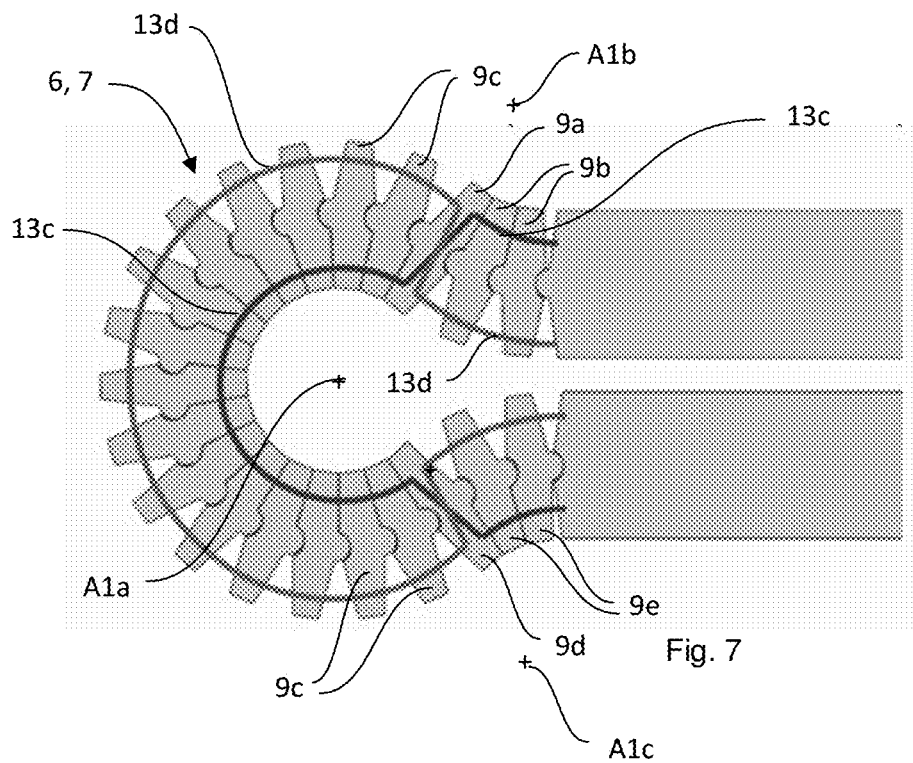
FIG. 7 shows a cross-sectional side view of a hinge assembly in accordance with one embodiment of the present invention, wherein the hinge assembly is in a folded position.

In a further embodiment, the hinge assembly 1 comprises a neutral axis N, and the linear drive arrangements 13 comprise a first section 13c and a second section 13d extending through an individual hinge blade 9a and engaging the rotation shaft 12 at a first end 13a of the linear drive arrangement 13. The first section 13c and the second section 13d extend partially on opposite sides of, and with equidistant spacing from, the neutral axis N. The first section 13c extends in a first area between the first end 13a of the linear drive arrangement 13 and the individual hinge blade 9a, on a first side of the neutral axis N, and the second section 13d extends in the first area between the first end 13a of the linear drive arrangement 13 and the individual hinge blade 9a, on a second side of the neutral axis N, as indicated in FIG. 7. The first section 13c and the second section 13d may furthermore engage the individual hinge blade 9a by extending through the individual hinge blade 9a such that the first section 13c extends from the first side of the neutral axis N to the second side of the neutral axis N, and the second section 13d extends from the second side of the neutral axis N to the first side of the neutral axis N, the first section 13c and the second section 13d effectively crossing each other in the area of the individual hinge blade 9a. The first section 13c may subsequently extend, in a second area between the individual hinge blade 9a and the second end 13b of the linear drive arrangement 13, on the second side of the neutral axis N, and the second section 13d extend, in the second area, on the first side of the neutral axis N between the individual hinge blade 9a and the second end 13b of the linear drive arrangement 13.

The first section 13c and the second section 13d may furthermore engage a second individual hinge blade 9d and extend through the second individual hinge blade 9d such that the first section 13c extends back from the second side of the neutral axis N to the first side of the neutral axis N, and the second section 13d extends back from the first side of the neutral axis N to the second side of the neutral axis N, the first section 13c and the second section 13d effectively crossing each other in the area of the second individual hinge blade 9d. The first section 13c may thereafter extend, in a third area between the second individual hinge blade 9d and the second end 13b of the linear drive arrangement 13, on the first side of the neutral axis N, and the second section 13d extend, in the third area, on the second side of the neutral axis N between the second individual hinge blade 9d and the second end 13b of the linear drive arrangement 13.

This allows any hinge blades 9c located in the second area to be pivoted in a first direction around the first hinge assembly rotation axis A1a, and, simultaneously, allows any hinge blades 9b located in the first area to be pivoted in an opposite, second direction around a second hinge assembly rotation axis A1b, and any hinge blades 9e located in the third area to be pivoted in the opposite, second direction around a third hinge assembly rotation axis A1c, the second hinge assembly rotation axis A1b and the third hinge assembly rotation axis A1c both extending in parallel with the first hinge assembly rotation axis A1a.

The linear drive arrangement 13 may comprise a chain (not shown) or a wire, as shown in FIGS. 2 to 7.

Figure 5:
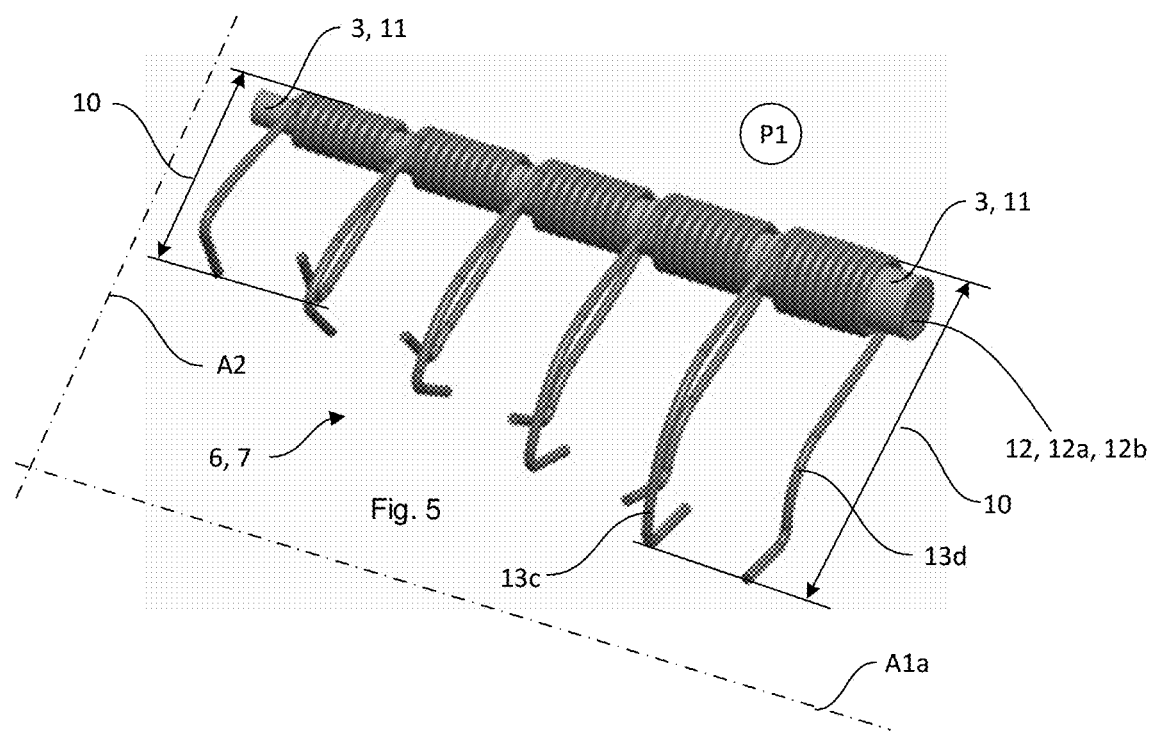
FIG. 5 shows a perspective view of a linear actuator of a hinge assembly in accordance with one embodiment of the present invention.

When the linear drive arrangement 13 comprises a wire, it may be partially wound around the rotation shaft 12, as shown in FIG. 5, and extend through the hinge assembly along the actuator axis A2. A first rotation of the rotation shaft 12 rotates the linear drive arrangement 13 in a first direction, and an opposite, second rotation of the rotation shaft 12 rotates the linear drive arrangement 13 in a second direction. The wire may comprise two separate wire sections 13a, 13b extending in parallel between the first frame section 4 and the second frame section 5, or the wire may comprise an uninterrupted loop.

The linear drive arrangement 13 may furthermore comprise at least one chain, as shown in FIGS. 9a to 9c. The linear drive arrangement 13 may comprise two separate chain sections extending in parallel between the first frame section 4 and the second frame section 5. In one embodiment, the rotation shaft 12 comprises at least one pinion and the linear drive arrangement 13 furthermore comprises at least a first rack connected to the chain and engaging the pinion at a first location. A first rotation of the rotation shaft 12 and the pinion moves the rack in a first direction along the actuator axis A2, hence pulling the chain in the first direction, and an opposite, second rotation of the rotation shaft 12 and the pinion moves the rack in a second direction along the actuator axis A2, hence pushing the chain in the second direction. The linear drive arrangement 13 may further comprise a second rack connected to the chain and engaging the pinion at a second location opposite the first location and extending along the actuator axis A2. A first rotation of the rotation shaft 12 and the pinion simultaneously moves the first rack in the first direction and the second rack in the second direction, such that the first rack pulls the chain in the first direction and the second rack, simultaneously, pushes the chain in the first direction. An opposite, second rotation of the rotation shaft 12 and the pinion simultaneously moves the first rack in the second direction and the second rack in the first direction, such that the first rack pushes the chain in the second direction and the second rack, simultaneously, pulls the chain in the second direction. The first rack may be connected to the display 2 while the second rack is connected to the back cover, such that the display 2 and the back cover are moved simultaneously in opposite directions, along the actuator axis A2, when the linear actuator 6, 7 is actuated.

As previously mentioned, the present disclosure also relates to an electronic device 14, shown in FIGS. 10*a* and 10*b*, comprising the above described hinge assembly 1. In one embodiment, the display 2 and/or the back cover of the electronic device are fixedly connected to the first frame section 4, and pivoting the first frame section 4 or the second frame section 5 will actuate the linear actuator 6, 7. The linear actuator 6, 7 urges the display 2 and/or the back cover to slide in relation to the hinge assembly 1 such that an overlap between the display 2 and/or the back cover and the second frame section 5 varies, as shown in, e.g., FIG. 10*a*. The overlap between the display 2 and the second frame section 5 is at a minimum when the hinge assembly 1 is in the first folded end position P2*a*. The overlap between the display 2 and the second frame section 5 is at a maximum when the hinge assembly 1 is in the second folded end position P2*b*.

In a further embodiment, the display 2 or the back cover is fixedly connected to the first frame section 4 and second frame section 5. The hinge assembly 1 comprises sliding rails interconnecting the hinge assembly 1 and the second frame section 5, and pivoting the first frame section 4 or the second frame section 5 actuates the linear actuator 6, 7. The linear actuator 6, 7 urges the second frame section 5 to slide, on the sliding rails 11, in relation to the hinge assembly such that the distance between the hinge assembly 1 and the second frame section 5 varies, as shown in FIG. 10*b*. The distance between the hinge assembly 1 and the second frame section 5 is at a minimum when the hinge assembly 1 is in the first folded end position P2*a*. The hinge assembly 1 may, correspondingly, be moveable between an unfolded position P1 and a second folded end position P2*b*, the distance between the hinge assembly 1 and the second frame section 5 being at a maximum when the hinge assembly 1 is in the second folded end position P2*b*.

The various aspects and implementations have been described in conjunction with various embodiments herein. However, other variations to the disclosed embodiments can be understood and effected by those skilled in the art in practicing the claimed subject-matter, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A hinge assembly for an electronic device, the hinge assembly comprising:
   a row of interconnected and abutting hinge blades, wherein the hinge assembly is configured to be moveable between an unfolded position and at least a first folded end position, and the hinge blades are aligned in a common plane when the hinge assembly is in the unfolded position, and wherein each hinge blade of the hinge blades is configured to be rotated relative to neighboring hinge blades around a first hinge assembly rotation axis when the hinge assembly is moved to the at least the first folded end position; and
   at least one linear actuator, comprising a rotation shaft and a plurality of linear drive arrangements having different lengths, wherein the rotation shaft extends in a direction that is parallel to the first hinge assembly rotation axis, and the rotation shaft comprises sections having different diameters, wherein a first end of each linear drive arrangement is interconnected with a section of the rotation shaft having a respective diameter, wherein a second, opposite end of each linear drive arrangement is connected to a respective hinge blade of the hinge blades, an actuator axis extends between the first end and the second end of each linear drive arrangement and perpendicular to the first hinge assembly rotation axis, and wherein the at least one linear actuator is configured in a manner that actuation of the at least one linear actuator along the actuator axis causes each hinge blade to rotate relative neighboring hinge blades around the first hinge assembly rotation axis.

2. The hinge assembly according to claim 1, wherein the hinge assembly is configured in a manner that rotation of the hinge blades is initiated successively by the differing diameters of the rotation shaft.

3. The hinge assembly according to claim 1, wherein the at least one linear actuator comprises at least a first linear actuator and a second linear actuator, and wherein:
   the first linear actuator comprises a first rotation shaft and a plurality of first linear drive arrangements,
   the second linear actuator comprises a second rotation shaft and a plurality of second linear drive arrangements, and
   the first rotation shaft and the second rotation shaft extend in parallel directions, and the plurality of first linear drive arrangements and the plurality of second linear drive arrangements extend in parallel directions.

4. The hinge assembly according to claim 3, wherein a first linear drive arrangement of the plurality of first linear drive arrangements and a second linear drive arrangement of the plurality of second linear drive arrangements are connected to a same hinge blade of the hinge blades in a manner that synchronizes the actuation of the first linear actuator and the second linear actuator.

5. The hinge assembly according to claim 3, wherein a first dimension of a first outer surface of the hinge assembly is larger than a corresponding second dimension of a second outer surface of the hinge assembly when the hinge assembly is in the first folded end position, and
   wherein the first linear actuator or the second linear actuator is configured to be actuated by a difference between the first dimension and the second dimension.

6. The hinge assembly according to claim 1, wherein each linear drive arrangement of the plurality of linear drive arrangements comprises a chain or a wire.

7. The hinge assembly according to claim 1, wherein:
the hinge assembly comprises a neutral axis;
the first end of each linear drive arrangement of the plurality of linear drive arrangements engages the rotation shaft;
the second end of each linear drive arrangement of the plurality of linear drive arrangements engages a first location and a second location of a respective hinge blade of the hinge blades, the first location and the second location of each respective hinge blade being located on opposite sides of, and with equidistant spacing from, the neutral axis;
each linear drive arrangement of the plurality of linear drive arrangements extends through any hinge blades located in a first area between each respective hinge blade and the rotation shaft;
each linear drive arrangement of the plurality of linear drive arrangements comprises a first section and a second section extending on opposite sides of, and with equidistant spacing from, the neutral axis; and
the hinge assembly is configured in a manner that a first rotation of the rotation shaft rotates each linear drive arrangement in a first direction, and a second rotation of the rotation shaft rotates each linear drive arrangement in a second direction.

8. The hinge assembly according to claim 7, wherein each linear drive arrangement of the plurality of linear drive arrangements comprises a wire partially wound around the rotation shaft.

9. The hinge assembly according to claim 1, wherein:
the hinge assembly comprises a neutral axis;
each linear drive arrangement of the plurality of linear drive arrangements comprises a first section and a second section extending through a respective hinge blade of the hinge blades and engaging the rotation shaft at the first end of the respective linear drive arrangement;
the first section and the second section of each linear drive arrangement extend partially on opposite sides of, and with equidistant spacing from, the neutral axis;
the first section of each linear drive arrangement extends in a first area between the first end and the respective hinge blade, on a first side of the neutral axis, and the second section of each linear drive arrangement extends in the first area on a second side of the neutral axis;
the first section and the second section of each linear drive arrangement further engage each respective hinge blade by extending through the respective hinge blade in a manner that the first section extends from the first side of the neutral axis to the second side of the neutral axis, and the second section extends from the second side of the neutral axis to the first side of the neutral axis;
the first section of each linear drive arrangement extends, in a second area between the respective hinge blade and the second end of the corresponding linear drive arrangement, on the second side of the neutral axis and the second section of each linear drive arrangement extends, in the second area, on the first side of the neutral axis; and
the hinge assembly is configured to allow any hinge blades located in the second area to be pivoted in a first direction around the first hinge assembly rotation axis, and, simultaneously, to allow any hinge blades located in the first area to be pivoted in an opposite, second direction around a second hinge assembly rotation axis extending in a direction that is parallel to the first hinge assembly rotation axis.

10. The hinge assembly according to claim 9, wherein the first section and the second section of each linear drive arrangement further engage a second respective hinge blade by extending through the second respective hinge blade in a manner that the respective first section extends back from the second side of the neutral axis to the first side of the neutral axis, and the respective second section extends back from the first side of the neutral axis to the second side of the neutral axis; and
wherein the first section of each linear drive arrangement extends, in a third area between the respective second hinge blade and the second end of the respective linear drive arrangement, on the first side of the neutral axis, and each second section extends, in the third area, on the second side of the neutral axis; and
wherein the hinge blade assembly is configured to allow any hinge blades located in the third area to be pivoted in the opposite, second direction around a third hinge assembly rotation axis extending in parallel with the first hinge assembly rotation axis.

11. An electronic device, comprising:
a first frame section;
a second frame section;
a display connected to at least one of said first frame section or the second frame section; and
a hinge assembly interconnecting said first frame section and the second frame section in a manner that the first frame section and the second frame section are pivotable, relative to each other, between an unfolded position and a first folded end position, the first frame section and the second frame section being aligned in a common plane when in the unfolded position, the second frame section being superimposed on the first frame section when in the first folded end position, and the hinge assembly comprising:
a row of interconnected and abutting hinge blades, wherein the hinge assembly is configured to be moveable between the unfolded position and the first folded end position, and the hinge blades are aligned in a common plane when the hinge assembly is in the unfolded position, and wherein each hinge blade of the hinge blades is configured to be rotated relative to neighboring hinge blades around a first hinge assembly rotation axis when the hinge assembly is moved to the first folded end position; and
at least one linear actuator, comprising a rotation shaft and a plurality of linear drive arrangements having different lengths, wherein the rotation shaft extends in a direction that is parallel to the first hinge assembly rotation axis, and the rotation shaft comprises sections having different diameters, wherein a first end of each linear drive arrangement is interconnected with a section of the rotation shaft having a respective diameter, wherein a second, opposite end of each linear drive arrangement is connected to a respective hinge blade of the hinge blades, an actuator axis extends between the first end and the second end of each linear drive arrangement and perpendicular to the first hinge assembly rotation axis, and wherein the at least one linear actuator is configured in a manner that actuation of the at least one linear actuator along the actuator axis causes each hinge blade to rotate relative neighboring hinge blades around the first hinge assembly rotation axis.

12. The electronic device according to claim 11, wherein the hinge assembly further interconnects the first frame section and the second frame section in a manner that the first frame section and the second frame section are pivotable, relative each other, between the unfolded position and a second folded end position, the first frame section being superimposed on the second frame section when in the second folded end position.

13. The electronic device according to claim 11, wherein the hinge assembly is configured in a manner that rotation of the hinge blades is initiated successively by the differing diameters of the rotation shaft.

14. The electronic device according to claim 11, wherein the at least one linear actuator comprises at least a first linear actuator and a second linear actuator, and wherein:
the first linear actuator comprises a first rotation shaft and a plurality of first linear drive arrangements,
the second linear actuator comprises a second rotation shaft and a plurality of second linear drive arrangements, and
the first rotation shaft and the second rotation shaft extend in parallel directions, and the plurality of first linear drive arrangements and the plurality of second linear drive arrangements extend in parallel directions.

15. The electronic device according to claim 14, wherein a first linear drive arrangement of the plurality of first linear drive arrangements and a second linear drive arrangement of the plurality of second linear drive arrangements are connected to a same hinge blade of the hinge blades in a manner that synchronizes the actuation of the first linear actuator and the second linear actuator.

16. The electronic device according to claim 14, wherein a first dimension of a first outer surface of the hinge assembly is larger than a corresponding second dimension of a second outer surface of the hinge assembly when the hinge assembly is in the first folded end position, and
wherein the first linear actuator or the second linear actuator is configured to be actuated by a difference between the first dimension and the second dimension.

17. The electronic device according to claim 11, wherein each linear drive arrangement of the plurality of linear drive arrangements comprises a chain or a wire.

18. The electronic device according to claim 11, wherein:
the hinge assembly comprises a neutral axis;
the first end of each linear drive arrangement of the plurality of linear drive arrangements engages the rotation shaft;
the second end of each linear drive arrangement of the plurality of linear drive arrangements engages a first location and a second location of a respective hinge blade of the hinge blades, the first location and the second location of each respective hinge blade being located on opposite sides of, and with equidistant spacing from, the neutral axis;
each linear drive arrangement of the plurality of linear drive arrangements extends through any hinge blades located in a first area between each respective hinge blade and the rotation shaft;
each linear drive arrangement of the plurality of linear drive arrangements comprises a first section and a second section extending on opposite sides of, and with equidistant spacing from, the neutral axis; and
the hinge assembly is configured in a manner that a first rotation of the rotation shaft rotates each linear drive arrangement in a first direction, and a second rotation of the rotation shaft rotates each linear drive arrangement in a second direction.

19. The electronic device according to claim 18, wherein each linear drive arrangement of the plurality of linear drive arrangements comprises a wire partially wound around the rotation shaft.

20. The electronic device according to claim 11, wherein:
the hinge assembly comprises a neutral axis;
each linear drive arrangement of the plurality of linear drive arrangements comprises a first section and a second section extending through a respective hinge blade of the hinge blades and engaging the rotation shaft at the first end of the respective linear drive arrangement;
the first section and the second section of each linear drive arrangement extend partially on opposite sides of, and with equidistant spacing from, the neutral axis;
the first section of each linear drive arrangement extends in a first area between the first end and the respective hinge blade, on a first side of the neutral axis, and the second section of each linear drive arrangement extends in the first area on a second side of the neutral axis;
the first section and the second section of each linear drive arrangement further engage each respective hinge blade by extending through the respective hinge blade in a manner that the first section extends from the first side of the neutral axis to the second side of the neutral axis, and the second section extends from the second side of the neutral axis to the first side of the neutral axis;
the first section of each linear drive arrangement extends, in a second area between the respective hinge blade and the second end of the corresponding linear drive arrangement, on the second side of the neutral axis and the second section of each linear drive arrangement extends, in the second area, on the first side of the neutral axis; and
the hinge assembly is configured to allow any hinge blades located in the second area to be pivoted in a first direction around the first hinge assembly rotation axis, and, simultaneously, to allow any hinge blades located in the first area to be pivoted in an opposite, second direction around a second hinge assembly rotation axis extending in a direction that is parallel to the first hinge assembly rotation axis.

* * * * *